(12) United States Patent
Asa et al.

(10) Patent No.: US 10,958,255 B1
(45) Date of Patent: Mar. 23, 2021

(54) FREQUENCY DOUBLER PULSE LIMITER AND METHODS FOR LIMITING PULSE WIDTHS PRODUCED BY A FREQUENCY DOUBLER

(71) Applicant: Intel Corporation, Santa Clara, CA (US)

(72) Inventors: Gil Asa, Zikhron Yaakov (IL); Assaf Ben-Bassat, Haifa (IL); Ofir Degani, Nes-Ammin (IL); Shahar Gross, Nes-Tziona (IL); Rotem Banin, Even-Yehuda (IL); Uri Grosglik, Tel Mond (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/727,958

(22) Filed: Dec. 27, 2019

(51) Int. Cl.
| | |
|---|---|
| *H03K 5/00* | (2006.01) |
| *H03K 5/133* | (2014.01) |
| *H03K 5/156* | (2006.01) |
| *H03K 5/1534* | (2006.01) |
| *G01R 31/3177* | (2006.01) |
| *G01R 31/3185* | (2006.01) |

(52) U.S. Cl.
CPC ..... *H03K 5/00006* (2013.01); *G01R 31/3177* (2013.01); *G01R 31/318525* (2013.01); *H03K 5/133* (2013.01); *H03K 5/1534* (2013.01); *H03K 5/1565* (2013.01)

(58) Field of Classification Search
CPC ........... H03K 5/00006; H03K 5/00013; H03K 5/00019; H03K 5/00058; H03K 5/13; H03K 5/133; H03K 5/134; H03K 5/135; H03K 5/14; G01R 31/3177; G01R 31/318525
See application file for complete search history.

(56) References Cited

U.S. PATENT DOCUMENTS 6,188,261 B1 * 2/2001 Nosaka ................... G06F 1/025
327/105

* cited by examiner

*Primary Examiner* — Diana J. Cheng
(74) *Attorney, Agent, or Firm* — Viering, Jentschura & Partner MBB

(57) ABSTRACT

This disclosure provides devices and methods for limiting the duration of pulses resulting from frequency modulation so as to provide for better propagation of a frequency doubler output within a communication device. The frequency doubler may be configured to receive a frequency doubler input and produce a modified frequency doubler output, wherein the frequency doubler includes a first flip-flop gate configured to receive a data input, a reset input, and a clock input and produce a first gate output; a first delay control configured to receive the gate output and produce a first delayed control output; and a first logic gate configured to receive the delayed control output and the frequency doubler input and produce a first logic gate output, wherein the modified frequency doubler output is based on the first logic gate output.

19 Claims, 14 Drawing Sheets

910- Positive Protecting Pulse

920- Negative Protecting Pulse

FREQUENCY DOUBLER PULSE LIMITER AND METHODS FOR LIMITING PULSE WIDTHS PRODUCED BY A FREQUENCY DOUBLER

TECHNICAL FIELD

Various embodiments relate generally to wireless communications.

BACKGROUND

As wireless communications begin to operate in higher frequencies, new problems arise when formulating solutions to meet the increasing demands for higher speeds and data throughputs while also considering hardware complexity and implementation issues. These problems may arise in the transmission and/or reception of signals between two or more devices or in the signal processing within a device itself. For instance, the introduction of devices operating at higher frequencies, e.g. in Wi-Fi devices operating in frequencies up to 7.2 GHz or beyond, presents issues in the modulation of signals for transmission. At these higher frequencies, propagating pulsed signals between signal processing components within a device prior to transmission becomes much more challenging due to the decreased duration of the pulses as a result of the frequency modulation. While these issues may presently be more prevalent in Wi-Fi communications operating in the 7.2 GHZ frequency band, for example, these issues may also apply to other radio access technologies (RATs) as they begin to operate in higher frequency bands.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
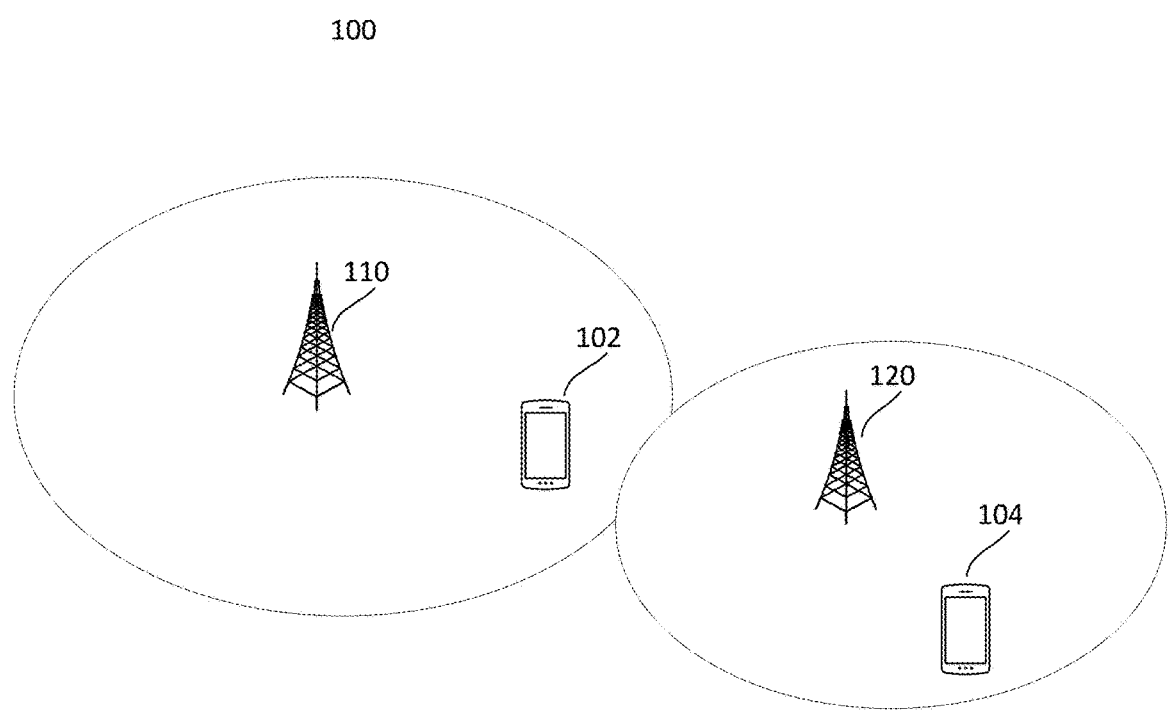
FIG. 1 shows an exemplary radio communication network according to some aspects.

Digital polar transmitters operating in high band frequencies may include a phase modulator followed by a frequency doubler and an amplitude modulator. While current schemes work well in wireless communication systems operating in frequencies up to 6 GHz, challenges arise at higher operating frequencies, such as Wi-Fi frequencies operating in the 7.2 GHz frequency band. One significant problem is that pulse widths at the output of a frequency doubler of the modulation scheme become more narrow at higher frequencies to the point that propagating them through the system, e.g. to an amplitude modulator, is much more challenging. The circuits and methods described in this disclosure balance the modulation between a lower part and an upper part of the frequency doubler output, thereby ensuring that all pulses are above a minimal pulse width which can still work reliably. In some aspects, the frequency doubler with pulse limiter as described herein may not require any further external control in order to function.

For example, other solutions to solve this problem may require higher speeds using larger and more complex devices which rely on more advanced and complex silicon processing. Also, these other solutions may require more complex modulation control and the addition of a dedicated control to the frequency doubler to manage the pulse widths. These problematic approaches result in a higher power consumption and faster transitioning that can result in crosstalk and supply bouncing. Furthermore, by employing additional dedicated controllers, new digital timing challenges need to be addressed. The devices and methods described herein provide effective pulse limiting of the output of the frequency doubler while avoiding these problematic solutions.

In some aspects, the methods and devices described herein provide mechanisms which effectively limit the pulse widths produced at the frequency doubler output while reducing, or eliminating completely, the need for external control. The frequency doublers according to some aspects of this disclosure, therefore, provide solutions to implement a limit on the pulse widths to ensure proper signal propagation through the rest of the system in an efficient manner while avoiding the need for increased hardware or controlling.

Accordingly, the methods and devices of the frequency doubler described herein allow for less power consumption than other solutions, while also providing a self-reset and being race free, i.e. where the system's behavior is not substantively dependent on the timing and/or sequence of other events. Furthermore, the self-aligned and self-contained system of the devices of this disclosure provide a simple, built-in solution that offers optimization in terms of doubler jitter and phase noise.

While sections of this disclosure may focus on transmission signal processing for Wi-Fi, it is appreciated that similar methods may be employed in the in other Radio Access Technologies (RATs) and are therefore intended to be included within the scope of this disclosure. In general, the devices and methods discussed herein may be applied to all RATs and between any communication devices that operate in higher frequencies wherein widths of the signal pulse become too narrow, especially after or during frequency modulation, and therefore challenging to propagate within the device.

The following detailed description refers to the accompanying exemplary drawings that show, by way of illustration, specific details and embodiments in which the invention may be practiced.

The word "exemplary" is used herein to mean "serving as an example, instance, or illustration." Any embodiment or design described herein as "exemplary" is not necessarily to be construed as preferred or advantageous over other embodiments or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one. The terms "proper subset", "reduced subset", and "lesser subset" refer to a subset of a set that is not equal to the set, i.e. a subset of a set that contains less elements than the set.

Any vector and/or matrix notation utilized herein is exemplary in nature and is employed solely for purposes of explanation. Accordingly, aspects of this disclosure accompanied by vector and/or matrix notation are not limited to being implemented solely using vectors and/or matrices, and that the associated processes and computations may be equivalently performed with respect to sets, sequences, groups, etc., of data, observations, information, signals, samples, symbols, elements, etc.

As used herein, "memory" are understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory, and thus may refer to a collective component including one or more types of memory. Any single memory component may be separated into multiple collectively equivalent memory components, and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

The term "terminal device" utilized herein refers to user-side devices (both portable and fixed) that can connect to a core network and/or external data networks via a radio access network. "Terminal device" can include any mobile or immobile wireless communication device, including User Equipment (UEs), Mobile Stations (MSs), Stations (STAs), cellular phones, tablets, laptops, personal computers, wearables, multimedia playback and other handheld or body-mounted electronic devices, consumer/home/office/commercial appliances, vehicles, and any other electronic device capable of user-side wireless communications. Without loss of generality, in some cases terminal devices can also include application-layer components, such as application processors or other general processing components that are directed to functionality other than wireless communications. Terminal devices can optionally support wired communications in addition to wireless communications. Furthermore, terminal devices can include vehicular communication devices that function as terminal devices.

The term "network access node" as utilized herein refers to a network-side device that provides a radio access network with which terminal devices can connect and exchange information with a core network and/or external data networks through the network access node. "Network access nodes" can include any type of base station or access point, including macro base stations, micro base stations, NodeBs, evolved NodeBs (eNBs), Home base stations, Remote Radio Heads (RRHs), relay points, Wi-Fi/WLAN Access Points (APs), Bluetooth master devices, DSRC RSUs, terminal devices acting as network access nodes, and any other electronic device capable of network-side wireless communications, including both immobile and mobile devices (e.g., vehicular network access nodes, moving cells, and other movable network access nodes). As used herein, a "cell" in the context of telecommunications may be understood as a sector served by a network access node. Accordingly, a cell may be a set of geographically co-located antennas that correspond to a particular sectorization of a network access node. A network access node can thus serve one or more cells (or sectors), where the cells are characterized by distinct communication channels. Furthermore, the term "cell" may be utilized to refer to any of a macrocell, microcell, femtocell, picocell, etc. Certain communication devices can act as both terminal devices and network access nodes, such as a terminal device that provides network connectivity for other terminal devices.

Various aspects of this disclosure may utilize or be related to radio communication technologies. While some examples may refer to specific radio communication technologies, e.g. Wi-Fi, the examples provided herein may be similarly applied to various other radio communication technologies, both existing and not yet formulated, particularly in cases where such radio communication technologies share similar features as disclosed regarding the following examples. Various exemplary radio communication technologies that the aspects described herein may utilize include, but are not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology, for example Universal Mobile Telecommunications System (UMTS), Freedom of Multimedia Access (FOMA), 3GPP Long Term Evolution (LTE), 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), Universal Mobile Telecommunications System (Third Generation) (UMTS (3G)), Wideband Code Division Multiple Access (Universal Mobile Telecommunications System) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), Universal Mobile Telecommunications System-Time-Division Duplex (UMTS-TDD), Time Division-Code Division Multiple Access (TD-CDMA), Time Division-Synchronous Code Division Multiple Access (TD-CDMA), 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP Rel. 18 (3rd Generation Partnership Project Release 18), 3GPP 5G, 3GPP LTE Extra, LTE-Advanced Pro, LTE Licensed-Assisted Access (LAA), MuLTEfire, UMTS Terrestrial Radio Access (UTRA), Evolved UMTS Terrestrial Radio Access (E-UTRA), Long Term Evolution Advanced (4th Generation) (LTE Advanced (4G)), cdmaOne (2G), Code division multiple access 2000 (Third generation) (CDMA2000 (3G)), Evolution-Data Optimized or Evolution-Data Only (EV-DO), Advanced Mobile Phone System (1st Generation) (AMPS (1G)), Total Access Communication arrangement/ Extended Total Access Communication arrangement (TACS/ETACS), Digital AMPS (2nd Generation) (D-AMPS (2G)), Push-to-talk (PTT), Mobile Telephone System (MTS), Improved Mobile Telephone System (IMTS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handyphone System (PHS), Wideband Integrated Digital Enhanced Network (WiDEN), iBurst, Unlicensed Mobile Access (UMA), also referred to as also referred to as 3GPP Generic Access Network, or GAN standard), Zigbee, Bluetooth®, Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, DSRC (Dedicated Short Range Communications) communication arrangements such as Intelligent-Transport-Systems, and other existing, developing, or future radio communication technologies. As used herein, a first radio communication technology may be different from a second radio communication technology if the first and second radio communication technologies are based on different communication standards.

Aspects described herein may use such radio communication technologies according to various spectrum management schemes, including, but not limited to, dedicated licensed spectrum, unlicensed spectrum, (licensed) shared spectrum (such as LSA, "Licensed Shared Access," in higher frequencies, e.g. above 6 GHz, and SAS, "Spectrum Access System," in higher frequencies, and may be used in various spectrum bands including, but not limited to, IMT (International Mobile Telecommunications) spectrum (including 450-470 MHz, 790-960 MHz, 1710-2025 MHz, 2110-2200 MHz, 2300-2400 MHz, 2500-2690 MHz, 698-790 MHz, 610-790 MHz, 3400-3600 MHz, etc., where some bands may be limited to specific region(s) and/or countries), IMT-advanced spectrum, IMT-2020 spectrum (expected to include 3600-3800 MHz, 3.5 GHz bands, 700 MHz bands, bands within the 24.25-86 GHz range, etc.), spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 64-71 GHz, 71-76 GHz, 81-86 GHz and 92-94 GHz, etc.), the ITS (Intelligent Transport Systems) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), the 70.2 GHz-71 GHz band, any band between 65.88 GHz and 71 GHz, bands currently allocated to automotive radar applications such as 76-81 GHz, and future bands including 94-300 GHz and above. Besides cellular applications, specific applications for vertical markets may be addressed such as PMSE (Program Making and Special Events), medical, health, surgery, automotive, low-latency, drones, etc. applications. Furthermore, aspects described herein may also use radio communication technologies with a hierarchical application, such as by introducing a hierarchical prioritization of usage for different types of users (e.g., low/medium/high priority, etc.), based on a prioritized access to the spectrum e.g., with highest priority to tier-1 users, followed by tier-2, then tier-3, etc. users, etc. Aspects described herein can also use radio communication technologies with different Single Carrier or OFDM flavors (CP-OFDM, SC-FDMA, SC-OFDM, filter bank-based multicarrier (FBMC), OFDMA, etc.) and in particular 3GPP NR (New Radio), which can include allocating the OFDM carrier data bit vectors to the corresponding symbol resources.

For purposes of this disclosure, radio communication technologies may be classified as one of a Short Range radio communication technology or Cellular Wide Area radio communication technology. Short Range radio communication technologies may include Bluetooth, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UMTS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMax) (e.g., according to an IEEE 802.16 radio communication standard, e.g., WiMax fixed or WiMax mobile), etc., and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

The terms "radio communication network" and "wireless network" as utilized herein encompasses both an access section of a network (e.g., a radio access network (RAN) section) and a core section of a network (e.g., a core network section).

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e. unidirectional or bidirectional communication in one or both of the incoming and outgoing directions. The term "calculate" encompass both 'direct' calculations via a mathematical expression/formula/relationship and 'indirect' calculations via lookup or hash tables and other array indexing or searching operations.

Figure 2:
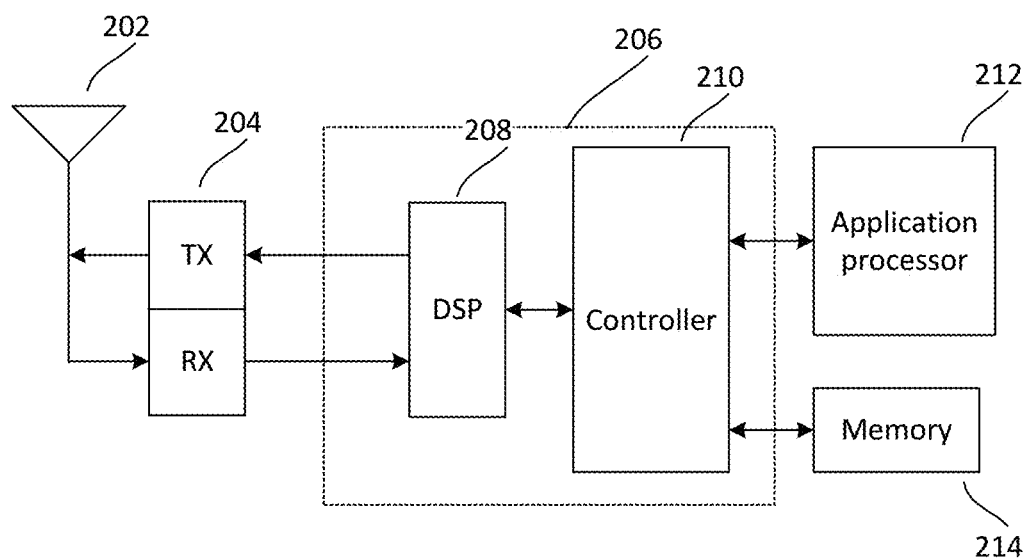
FIG. 2 shows an exemplary internal configuration of terminal device according to some aspects.

FIGS. 1 and 2 depict an exemplary network and device architecture for wireless communications. In particular, FIG. 1 shows exemplary radio communication network 100 according to some aspects, which may include terminal devices 102 and 104 and network access nodes 110 and 120. Radio communication network 100 may communicate with terminal devices 102 and 104 via network access nodes 110 and 120 over a radio access network. Although certain examples described herein may refer to a particular radio access network context (e.g., WLAN/Wi-Fi, Bluetooth, LTE, UMTS, GSM, other 3rd Generation Partnership Project (3GPP) networks, 5G, etc.), these examples are demonstrative and may therefore be readily applied to any other type or configuration of radio access network. The number of network access nodes and terminal devices in radio communication network 100 is exemplary and is scalable to any amount.

In an exemplary cellular context, network access nodes 110 and 120 may be Wi-Fi Access Points (APs) or a base station (e.g., eNodeBs, gNodeBs) or any other type of base station), while terminal devices 102 and 104 may be cellular terminal devices (e.g., Mobile Stations (MSs), User Equipment(s) (UEs), or any type of cellular terminal device). Network access nodes 110 and 120 may therefore interface (e.g., via backhaul interfaces) with a core network such as an Evolved Packet Core (EPC, for LTE), Core Network (CN, for UMTS), or other core networks, which may also be considered part of radio communication network 100. The core network may interface with one or more external data networks. In an exemplary short-range context, network access node 110 and 120 may be access points (APs, e.g., WLAN or Wi-Fi APs), while terminal device 102 and 104 may be short range terminal devices (e.g., stations (STAs)). Network access nodes 110 and 120 may interface (e.g., via an internal or external router) with one or more external data networks.

Network access nodes 110 and 120 (and, optionally, other network access nodes of radio communication network 100 not explicitly shown in FIG. 1) may accordingly provide a radio access network (RAN) to terminal devices 102 and 104 (and, optionally, other terminal devices of radio communication network 100 not explicitly shown in FIG. 1). In an exemplary cellular context, the radio access network provided by network access nodes 110 and 120 may enable terminal devices 102 and 104 to wirelessly access the core network via radio communications. The core network may provide switching, routing, and transmission, for traffic data related to terminal devices 102 and 104, and may further provide access to various internal data networks (e.g., control nodes, routing nodes that transfer information between other terminal devices on radio communication network 100, etc.) and external data networks (e.g., data networks providing voice, text, multimedia (audio, video, image), and other Internet and application data). In an exemplary short-range context, the radio access network provided by network access nodes 110 and 120 may provide access to internal data networks (e.g., for transferring data between terminal devices connected to radio communication network 100) and external data networks (e.g., data networks providing voice, text, multimedia (audio, video, image), and other Internet and application data).

The radio access network and core network (if applicable, such as for a cellular context) of radio communication network 100 may be governed by communication protocols that can vary depending on the specifics of radio communication network 100. Such communication protocols may define the scheduling, formatting, and routing of both user and control data traffic through radio communication network 100, which includes the transmission and reception of such data through both the radio access and core network domains of radio communication network 100. Accordingly, terminal devices 102 and 104 and network access nodes 110 and 120 may follow the defined communication protocols to transmit and receive data over the radio access network domain of radio communication network 100, while the core network may follow the defined communication protocols to route data within and outside of the core network. Exemplary communication protocols include Wi-Fi, Bluetooth, LTE, UMTS, GSM, WiMAX, etc., any of which may be applicable to radio communication network 100.

FIG. 2 shows an internal configuration of terminal device 102 according to some aspects, which may include antenna system 202, radio frequency (RF) transceiver (i.e. front-end module circuitry) 204, baseband modem 206 (including digital signal processor 208 and protocol controller 210), application processor 212, and memory 214. Although not explicitly shown in FIG. 2, in some aspects terminal device 102 may include one or more additional hardware and/or software components, such as processors/microprocessors, controllers/microcontrollers, other specialty or generic hardware/processors/circuits, peripheral device(s), memory, power supply, external device interface(s), subscriber identity module(s) (SIMs), user input/output devices (display(s), keypad(s), touchscreen(s), speaker(s), external button(s), camera(s), microphone(s), etc.), or other related components.

Terminal device 102 may transmit and receive radio signals on one or more radio access networks. Baseband modem 206 may direct such communication functionality of terminal device 102 according to the communication protocols associated with each radio access network, and may execute control over antenna system 202 and RF transceiver 204 to transmit and receive radio signals according to the formatting and scheduling parameters defined by each communication protocol. Although various practical designs may include separate communication components (e.g., a separate antenna, RF transceiver, digital signal processor, and controller) for each supported radio communication technology (e.g., Wi-Fi, Bluetooth, 4G, 5G, etc.), for purposes of conciseness, the configuration of terminal device 102 shown in FIG. 2 depicts only a single instance of such components.

Terminal device 102 may transmit and receive wireless signals with antenna system 202, which may be a single antenna or an antenna array that includes multiple antennas. In some aspects, antenna system 202 may additionally include analog antenna combination and/or beamforming circuitry. In the receive (RX) path, RF transceiver 204 may receive analog radio frequency signals from antenna system 202 and perform analog and digital RF front-end processing on the analog radio frequency signals to produce digital baseband samples (e.g., In-Phase/Quadrature (IQ) samples) to provide to baseband modem 206. RF transceiver 204 may include analog and digital reception components including amplifiers (e.g., Low Noise Amplifiers (LNAs)), filters, RF demodulators (e.g., RF IQ demodulators)), and analog-to-digital converters (ADCs), which RF transceiver 204 may utilize to convert the received radio frequency signals to digital baseband samples. RF transceiver 204 may include dedicated hardware components, e.g., ASICs, FPGAs, and other hardware, that are digitally configured to specific execute processing functions. In the transmit (TX) path, RF transceiver 204 may receive digital baseband samples from baseband modem 206 and perform analog and digital RF front-end processing on the digital baseband samples to produce analog radio frequency signals to provide to antenna system 202 for wireless transmission. RF transceiver 204 may thus include analog and digital transmission components including amplifiers (e.g., Power Amplifiers (PAs)), filters, RF modulators (e.g., phase modulators, frequency modulators or doublers, amplitude modulators, RF IQ modulators, etc.), and digital-to-analog converters (DACs), which RF transceiver 204 may utilize to mix the digital baseband samples received from baseband modem 206 and produce the analog radio frequency signals for wireless transmission by antenna system 202. In some aspects baseband modem 206 may control the radio transmission and reception of RF transceiver 204, including specifying the transmit and receive radio frequencies for operation of RF transceiver 204.

As shown in FIG. 2, baseband modem 206 may include digital signal processor 208, which may perform physical layer (PHY, Layer 1) transmission and reception processing to, in the transmit path, prepare outgoing transmit data provided by protocol controller 210 for transmission via RF transceiver 204, and, in the receive path, prepare incoming received data provided by RF transceiver 204 for processing by protocol controller 210. Digital signal processor 208 may be configured to perform one or more of error detection, forward error correction encoding/decoding, channel coding and interleaving, channel modulation/demodulation, physical channel mapping, radio measurement and search, frequency and time synchronization, antenna diversity processing, power control and weighting, rate matching/dematching, retransmission processing, interference cancelation, and any other physical layer processing functions. Digital signal processor 208 may be structurally realized as hardware components (e.g., as one or more digitally-configured hardware circuits or FPGAs), software-defined components (e.g., one or more processors configured to execute program code defining arithmetic, control, and I/O instructions (e.g., software and/or firmware) stored in a non-transitory computer-readable storage medium), or as a combination of hardware and software components. In some aspects, digital signal processor 208 may include one or more processors configured to retrieve and execute program code that defines control and processing logic for physical layer processing operations. In some aspects, digital signal processor 208 may execute processing functions with software via the execution of executable instructions. In some aspects, digital signal processor 208 may include one or more dedicated hardware circuits (e.g., ASICs, FPGAs, and other hardware) that are digitally configured to specific execute processing functions, where the one or more processors of digital signal processor 208 may offload certain processing tasks to these dedicated hardware circuits, which are known as hardware accelerators. Exemplary hardware accelerators can include Fast Fourier Transform (FFT) circuits and encoder/decoder circuits. In some aspects, the processor and hardware accelerator components of digital signal processor 208 may be realized as a coupled integrated circuit.

Terminal device 102 may be configured to operate according to one or more radio communication technologies. Digital signal processor 208 may be responsible for lower-layer processing functions (e.g., Layer 1/PHY) of the radio communication technologies, while protocol controller 210 may be responsible for upper-layer protocol stack functions (e.g., Data Link Layer/Layer 2 and/or Network Layer/Layer 3). Protocol controller 210 may thus be responsible for controlling the radio communication components of terminal device 102 (antenna system 202, RF transceiver 204, and digital signal processor 208) in accordance with the communication protocols of each supported radio communication technology, and accordingly may represent the Access Stratum and Non-Access Stratum (NAS) (also encompassing Layer 2 and Layer 3) of each supported radio communication technology. Protocol controller 210 may be structurally embodied as a processor configured to execute protocol stack software (retrieved from a controller memory) and subsequently control the radio communication components of terminal device 102 to transmit and receive communication signals in accordance with the corresponding protocol stack control logic defined in the protocol stack software. Protocol controller 210 may include one or more processors configured to retrieve and execute program code that defines the upper-layer protocol stack logic for one or more radio communication technologies, which can include Data Link Layer/Layer 2 and Network Layer/Layer 3 functions. Protocol controller 210 may be configured to perform both user-plane and control-plane functions to facilitate the transfer of application layer data to and from radio terminal device 102 according to the specific protocols of the supported radio communication technology. User-plane functions can include header compression and encapsulation, security, error checking and correction, channel multiplexing, scheduling and priority, while control-plane functions may include setup and maintenance of radio bearers. The program code retrieved and executed by protocol controller 210 may include executable instructions that define the logic of such functions.

In some aspects, terminal device 102 may be configured to transmit and receive data according to multiple radio communication technologies. Accordingly, in some aspects one or more of antenna system 202, RF transceiver 204, digital signal processor 208, and protocol controller 210 may include separate components or instances dedicated to different radio communication technologies and/or unified components that are shared between different radio communication technologies. For example, in some aspects protocol controller 210 may be configured to execute multiple protocol stacks, each dedicated to a different radio communication technology and either at the same processor or different processors. In some aspects, digital signal processor 208 may include separate processors and/or hardware accelerators that are dedicated to different respective radio communication technologies, and/or one or more processors and/or hardware accelerators that are shared between multiple radio communication technologies. RF transceiver 204 may include separate RF circuitry sections dedicated to different respective radio communication technologies, and/or RF circuitry sections shared between multiple radio communication technologies. In some aspects, antenna system 202 may include separate antennas dedicated to different respective radio communication technologies, and/or antennas shared between multiple radio communication technologies. Accordingly, while antenna system 202, RF transceiver 204, digital signal processor 208, and controller 210 are shown as individual components in FIG. 2, in some aspects, antenna system 202, RF transceiver 204, digital signal processor 208, and/or controller 210 can encompass separate components dedicated to different radio communication technologies.

Figure 3:
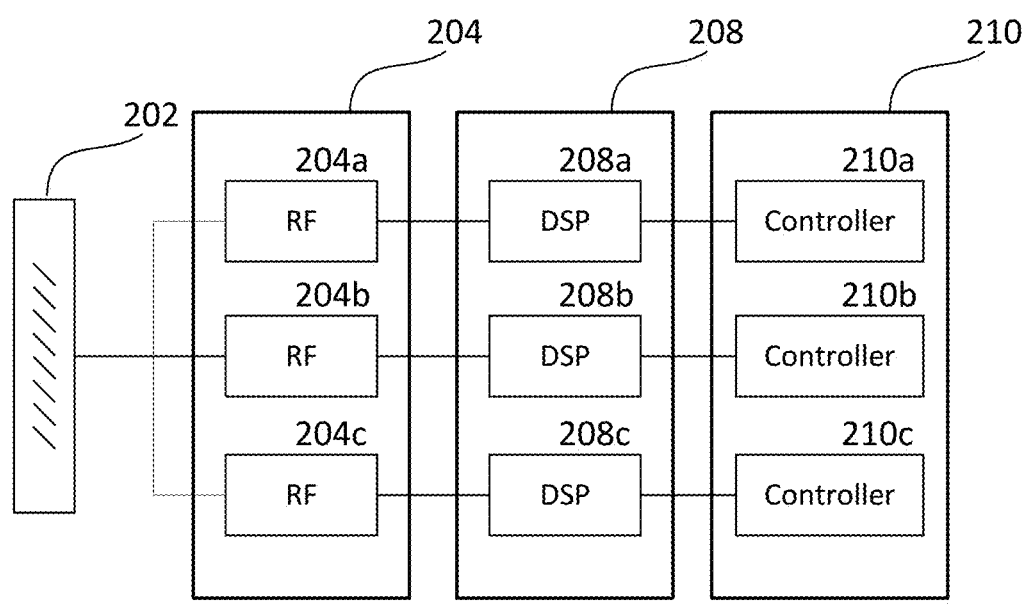
FIG. 3 shows an exemplary configuration of signal acquisition and/or transmission and processing circuitry according to some aspects.

FIG. 3 shows an example in which RF transceiver 204 includes RF transceiver 204a for a first radio communication technology, RF transceiver 204b for a second radio communication technology, and RF transceiver 204c for a third radio communication technology. Likewise, digital signal processor 208 includes digital signal processor 208a for the first radio communication technology, digital signal processor 208b for the second radio communication technology, and digital signal processor 208c for the third radio communication technology. Similarly, controller 210 may include controller 210a for the first radio communication technology, controller 210b for the second radio communication technology, and controller 210c for the third radio communication technology. RF transceiver 204a, digital signal processor 208a, and controller 210a thus form a communication arrangement (e.g., the hardware and software components dedicated to a particular radio communication technology) for the first radio communication technology, RF transceiver 204b, digital signal processor 208b, and controller 210b thus form a communication arrangement for the second radio communication technology, and RF transceiver 204c, digital signal processor 208c, and controller 210c thus form a communication arrangement for the third radio communication technology. The components of the different radio communication technologies may share a common antenna system, e.g. 202 as shown in FIG. 3, or they may each have an antenna system dedicated specifically to each one of them. In some aspects, certain radio communication technologies may share an antenna or antenna array, e.g., LTE and 5G may share a common antenna system, while other radio communication technologies, e.g. Wi-Fi and Bluetooth, share a separate antenna or antenna array.

While depicted as being logically separate in FIG. 3, any components of the communication arrangements may be integrated into a common component.

Terminal device 102 may also include application processor 212 and memory 214. Application processor 212 may be a CPU, and may be configured to handle the layers above the protocol stack, including the transport and application layers. Application processor 212 may be configured to execute various applications and/or programs of terminal device 102 at an application layer of terminal device 102, such as an operating system (OS), a user interface (UI) for supporting user interaction with terminal device 102, and/or various user applications. The application processor may interface with baseband modem 206 and act as a source (in the transmit path) and a sink (in the receive path) for user data, such as voice data, audio/video/image data, messaging data, application data, basic Internet/web access data, etc. In the transmit path, protocol controller 210 may therefore receive and process outgoing data provided by application processor 212 according to the layer-specific functions of the protocol stack, and provide the resulting data to digital signal processor 208. Digital signal processor 208 may then perform physical layer processing on the received data to produce digital baseband samples, which digital signal processor may provide to RF transceiver 204. RF transceiver 204 may then process the digital baseband samples to convert the digital baseband samples to analog RF signals, which RF transceiver 204 may wirelessly transmit via antenna system 202. In the receive path, RF transceiver 204 may receive analog RF signals from antenna system 202 and process the analog RF signals to obtain digital baseband samples. RF transceiver 204 may provide the digital baseband samples to digital signal processor 208, which may perform physical layer processing on the digital baseband samples. Digital signal processor 208 may then provide the resulting data to protocol controller 210, which may process the resulting data according to the layer-specific functions of the protocol stack and provide the resulting incoming data to application processor 212. Application processor 212 may then handle the incoming data at the application layer, which can include execution of one or more application programs with the data and/or presentation of the data to a user via a user interface.

Memory 214 may embody a memory component of terminal device 102, such as a hard drive or another such permanent memory device. Although not explicitly depicted in FIG. 2, the various other components of terminal device 102 shown in FIG. 2 may additionally each include integrated permanent and non-permanent memory components, such as for storing software program code, buffering data, etc.

In accordance with some radio communication networks, terminal devices 102 and 104 may execute mobility procedures to connect to, disconnect from, and switch between available network access nodes of the radio access network of radio communication network 100. As each network access node of radio communication network 100 may have a specific coverage area, terminal devices 102 and 104 may be configured to select and re-select between the available network access nodes in order to maintain a strong radio access connection with the radio access network of radio communication network 100. For example, terminal device 102 may establish a radio access connection with network access node 110 while terminal device 104 may establish a radio access connection with network access node 120. In the event that the current radio access connection degrades, terminal devices 102 or 104 may seek a new radio access connection with another network access node of radio communication network 100; for example, terminal device 102 may move from the coverage area of network access node 110 into the coverage area of network access node 120. As a result, the radio access connection with network access node 120 may degrade, which terminal device 104 may detect via radio measurements such as signal strength or signal quality measurements of network access node 120. Depending on the mobility procedures defined in the appropriate network protocols for radio communication network 100, terminal device 104 may seek a new radio access connection (which may be, for example, triggered at terminal device 104 or by the radio access network), such as by performing radio measurements on neighboring network access nodes to determine whether any neighboring network access nodes can provide a suitable radio access connection. As terminal device 104 may have moved into the coverage area of network access node 110, terminal device 104 may identify network access node 110 (which may be selected by terminal device 104 or selected by the radio access network) and transfer to a new radio access connection with network access node 110. Such mobility procedures, including radio measurements, cell selection/reselection, and handover are established in the various network protocols and may be employed by terminal devices and the radio access network in order to maintain strong radio access connections between each terminal device and the radio access network across any number of different radio access network scenarios.

Figure 4:
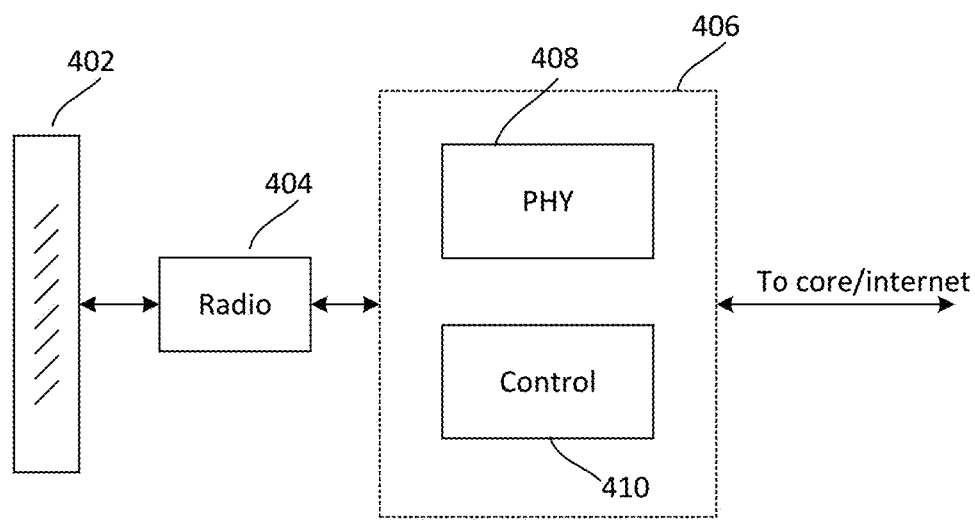
FIG. 4 shows an exemplary internal configuration of a network access node in some aspects.

FIG. 4 shows an exemplary internal configuration of a network access node, such as network access node 110, according to some aspects. As shown in FIG. 4, network access node 110 may include antenna system 402, radio transceiver 404, and baseband subsystem 406 (including physical layer processor 408 and protocol controller 410). In an abridged overview of the operation of network access node 110, network access node 110 may transmit and receive wireless signals via antenna system 402, which may be an antenna array including multiple antennas. Radio transceiver 404 may perform transmit and receive RF processing to convert outgoing baseband samples from baseband subsystem 406 into analog radio signals to provide to antenna system 402 for radio transmission and to convert incoming analog radio signals received from antenna system 402 into baseband samples to provide to baseband subsystem 406. Physical layer processor 408 may be configured to perform transmit and receive PHY processing on baseband samples received from radio transceiver 404 to provide to controller 410 and on baseband samples received from controller 410 to provide to radio transceiver 404. Controller 410 may control the communication functionality of network access node 110 according to the corresponding radio communication technology protocols, which may include exercising control over antenna system 402, radio transceiver 404, and physical layer processor 408. Each of radio transceiver 404, physical layer processor 408, and controller 410 may be structurally realized with hardware (e.g., with one or more digitally-configured hardware circuits or FPGAs), as software (e.g., as one or more processors executing program code defining arithmetic, control, and I/O instructions stored in a non-transitory computer-readable storage medium), or as a mixed combination of hardware and software. In some aspects, radio transceiver 404 may be a radio transceiver including digital and analog radio frequency processing and amplification circuitry. In some aspects, radio transceiver 404 may be a software-defined radio (SDR) component implemented as a processor configured to execute software-defined instructions that specify radio frequency processing routines. Physical layer processor 408 may include a processor and one or more hardware accelerators, wherein the processor is configured to control physical layer processing and offload certain processing tasks to the one or more hardware accelerators. Controller 410 may be a controller configured to execute software-defined instructions that specify upper-layer control functions. Controller 310 may be limited to radio communication protocol stack layer functions, while in other aspects controller 410 may also be configured for transport, internet, and application layer functions.

Network access node 110 may thus provide the functionality of network access nodes in radio communication networks by providing a radio access network to enable served terminal devices to access communication data. For example, network access node 110 may also interface with a core network, one or more other network access nodes, or various other data networks and servers via a wired or wireless backhaul interface.

The methods described herein may be controlled and carried out by the components of a terminal device 102 (e.g., circuitry in the RF transceiver 204 or the baseband modem 206) or by the components of the network access node 110 (e.g., a Wi-Fi AP). It is appreciated that while some parts of this explanation may be directed towards a particular radio access technology (e.g. Wi-Fi), a particular communication device (e.g. a terminal device, i.e. a UE), or a particular signal processing direction (e.g. transmission), the methods and devices described herein may be deployed according to other communication standards and directions in which the widths of signal pulses need to be controlled so as to avoid pulses with widths that are too narrow for effective propagation throughout the system.

Figure 5:
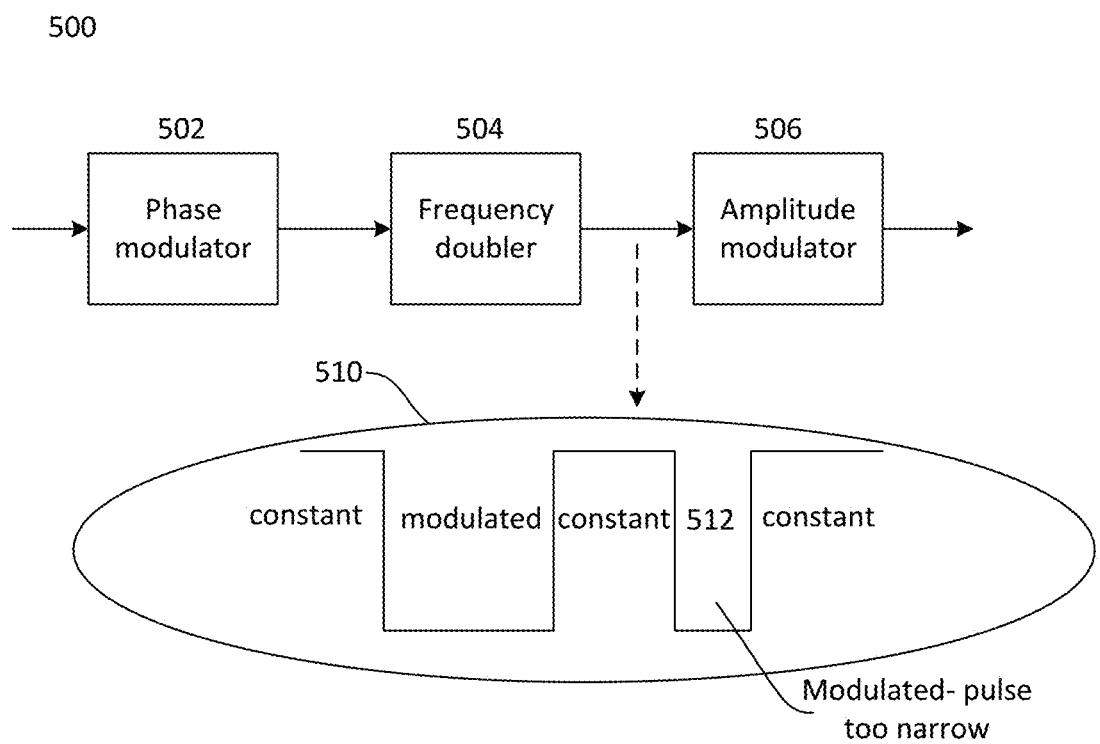
FIG. 5 shows an exemplary signal processing chain in a transmitter according to some aspects.

FIG. 5 shows an exemplary chain 500 of modulators in a transmit chain of a wireless communication device and pulses corresponding to an output of a frequency doubler 504 according to some aspects. As shown in FIG. 5, the pulses are illustrated and described as negative pulses, but it is appreciated that a similar approach may be applied to positive pulses as well and is covered by the scope of this disclosure.

In some aspects, phase modulator 502, frequency doubler 504, and amplitude modulator 506 may be implemented as part of an RF transceiver 204 configured to communicate according to one or more RATs, e.g., Wi-Fi or NR, or in a baseband modem 206 of a terminal device 102. Similarly, the chain of modulators 500 may be provided in the radio transceiver 404 or baseband subsystem 406 of network access node 110, e.g. Wi-Fi AP. In general and as described herein, the frequency doublers of this disclosure may be implemented as a part of any signal processing device where control of the pulse width at the frequency doubler output, e.g., to control narrow pulses for more accurate propagation to other components of the system, is desired.

In some aspects, phase modulator 502 and frequency doubler 504 work by modulating the pulse width while the it is low, and while when it is high, the width may be constant and equal to 1/(2*channel frequency). Signal pulses at the frequency doubler output 510 are illustrated as a series of alternating constant and modulated (including 512) pulses, although it is appreciated that other patterns may be provided at the frequency doubler output. As seen in FIG. 5, certain pulses in the modulated portion of the frequency doubler output 510 may be very narrow and difficult to propagate. An exemplary narrow pulse is shown in 512.

The signal (e.g. for transmission) may first be modulated by phase modulator 502, then the output of the phase modulator 502 may be fed to the frequency doubler 504 for further processing. After the frequency doubler 504 modifies the frequency of the pulses, the amplitude modulator 506 may receive the output of the frequency doubler and provide an amplitude modified output for sending to an antenna for transmission of the signal. However, if the pulses from the frequency doubler 504 to the amplitude modulator 506 are too narrow, e.g., as shown by 512, the pulses may disappear in the amplitude modulator 506, thereby making a proper reconstruction of the original signal very difficult.

In some aspects of this disclosure, the frequency doubler input (e.g., provided by the phase modulator) may have a constant high period and a modulated low period (or vice versa). Thus, when the modulated low period is too short, narrow pulses may result. However, the frequency doubler described herein solves this issue by implementing a "built-in pulser" (i.e. a pulse limiter) which is self-aligned with the frequency doubler input mid-transition. As a result, the frequency doubler according to some aspects of this disclosure is able to attach an internal, self-aligned pulse to the low period of the input, forcing it to a minimum configurable width. This pulse limitation is verified to have a negligible influence on the output spectrum. In other words, the frequency doubler of this disclosure is equipped with a "self-timer" configured to detect pulses that are more narrow than a pre-determined threshold (for example, in the range of 20 to 150 ps (picoseconds), or, more specifically, for example, in the range of 40-50 ps) and extend the detected narrow pulses to a minimum configured limit based on the pre-determined threshold by moving the latter edge of the narrow pulse to meet the minimum pulse width and lessens the proceeding latter pulse (after the pulse which is lengthened) by the same amount.

Figure 6:
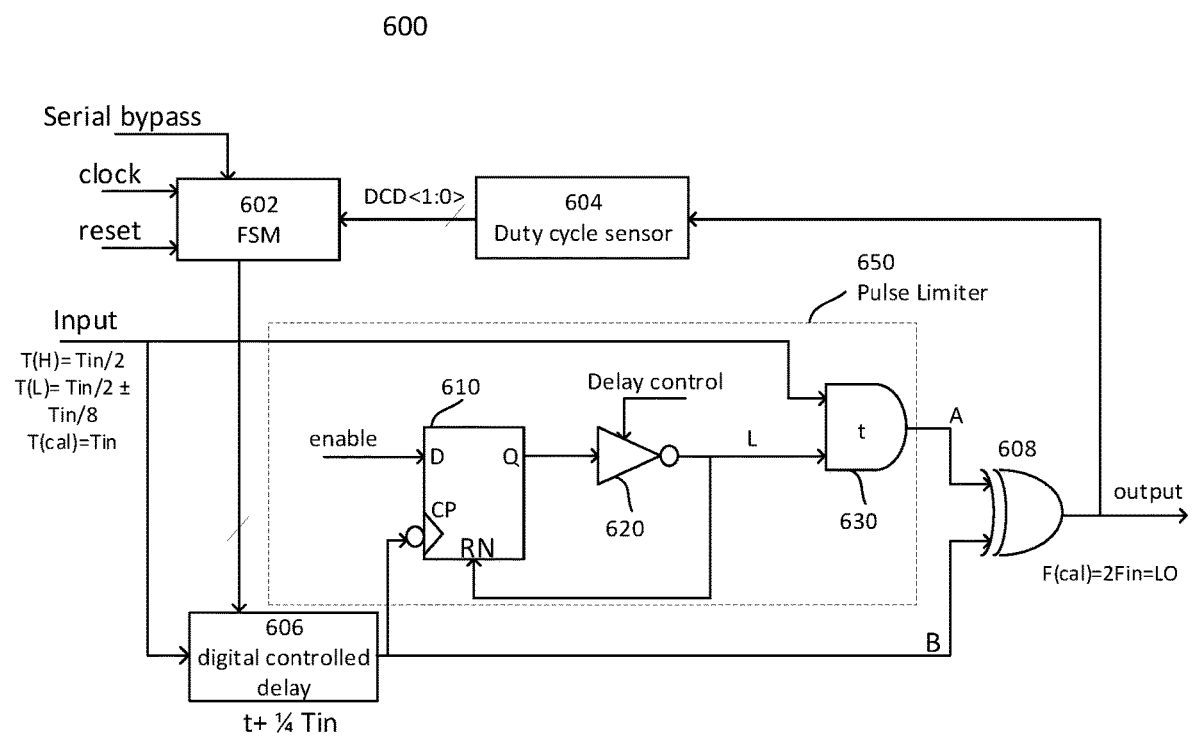
FIG. 6 shows an exemplary circuit layout of a frequency doubler according to some aspects.

FIG. 6 shows an exemplary frequency doubler 600 according to some aspects. It is appreciated that frequency doubler 600 is exemplary in nature and may thus be simplified for purposes of this explanation.

Frequency doubler 600 may include a pulse limiter 650 which includes a resettable flip-flop gate 610, a delay control 620, and a first logic gate 630, e.g., shown as an AND gate. The pulse limiter components work in conjunction to provide the modification of the detected narrow pulses as described herein.

Frequency doubler 600 may also include a finite state machine (FSM) 602 configured to provide receive a serial bypass, clock, and reset values and provide an input to the digital controlled delay circuit 606 of the frequency doubler 600. The FSM 602 may also be configured to receive a duty cycle distortion (DCD) information from a duty cycle sensor 604. The duty cycle sensor 604 may be configured to monitor the output of the frequency doubler 600 in order to obtain the duty cycle information to provide to the FSM 602. FSM 602 may include of one or more of combination, sequential, and/or output logic circuits.

Digital controlled delay circuit 606 may be configured to receive the input of the frequency doubler (shown on the left side of FIG. 6) and the output of the FSM 602 to produce one or more signals to send to other components of the frequency doubler 600. For example, as shown in FIG. 6, digital controlled delay circuit 606 may provide an output B which is fed to an output logic gate 608 (shown as an XOR gate) and the clock input CP to resettable flip-flop gate 610. As shown in FIG. 6, the output of digital controlled delay circuit 606 fed as the clock input CP to resettable flip-flop gate 610 is shown as being the same as B, i.e. it is taken from the output of digital controlled delay circuit 606. In some aspects, the output of digital controlled delay 606 fed as the clock input CP to resettable flip-flop gate 610 may be taken from a stage between the input and the output of digital controlled delay 606, i.e. the clock input CP to resettable flip-flop gate 610 is not the same as the signal B fed to output logic gate 608.

The frequency doubler 600 may be first calibrated with a 50% duty cycle at the input. In this manner, the calibration locks the time difference between A and B to be exactly ¼ Tin (Time input) while the output become 2*Fin (Frequency input) with a 50% duty cycle. The calibration starts with minimal duty cycle and sweeps the "digital controlled delay" provided by the digital controlled delay circuit 606 until the duty cycle is closest to 0.5 (i.e., 50%) with less than a 0.5% error. After calibration, the frequency doubler 600 is ready to receive the modulated input phase. In this explanation with respect to frequency doubler 600 (and the associated pulse charts shown in FIG. 7), the "low" period of the pulses are shown as being modulated, but it is appreciated that the "high" periods of the pulses may be modulated in similar manners with the appropriate corresponding structure.

In some aspects, for the frequency doubler configured to control the "low" periods of the pulses, the "high" periods may remain at ½ Tin while the "low" period is modulated. This means that when low period has a minimum value of ⅜ Tin, the output logic gate 608 output can have low periods of only ⅛ Tin. In the case of high band frequencies, for example, in 7.2 GHz operating frequencies, the negative pulse can have a duration of only 34.7 picoseconds (ps), which is very challenging for other components, e.g. amplifiers (amplitude modulators), to handle. Accordingly, frequency doubler 600 is able to avoid this problem by utilizing its configuration and the aforementioned pulse limiter 650 which guarantees that the output pulse of frequency doubler 600 will never be smaller than a pre-determined minimum, e.g. a minimum pulse that can be handled by the proceeding component. The pulse limiter 650 layout shown in FIG. 7 provides the ability of creating a synchronized, self-terminated pulse without a large RC component, or even without any RC component at all.

In frequency doubler 600, the pulse limiter 650 has a self-power reset RN thus its output starts on '0'. Then, after the clock edge (i.e. if enable='1'), the output rises to '1', thus asserting the self-reset which forces the output back to '0', thereby creating the "self-terminated" pulse. The duration of the self-terminated pulse may be defined by the formula t[delay]+t[RN2Q], wherein the delay may be programmed or controlled.

As shown by frequency doubler 600, the pulse limiter 650 has an inherent power reset because if Q initiates as '1', it is readily followed by a reset RN.

Figure 7:
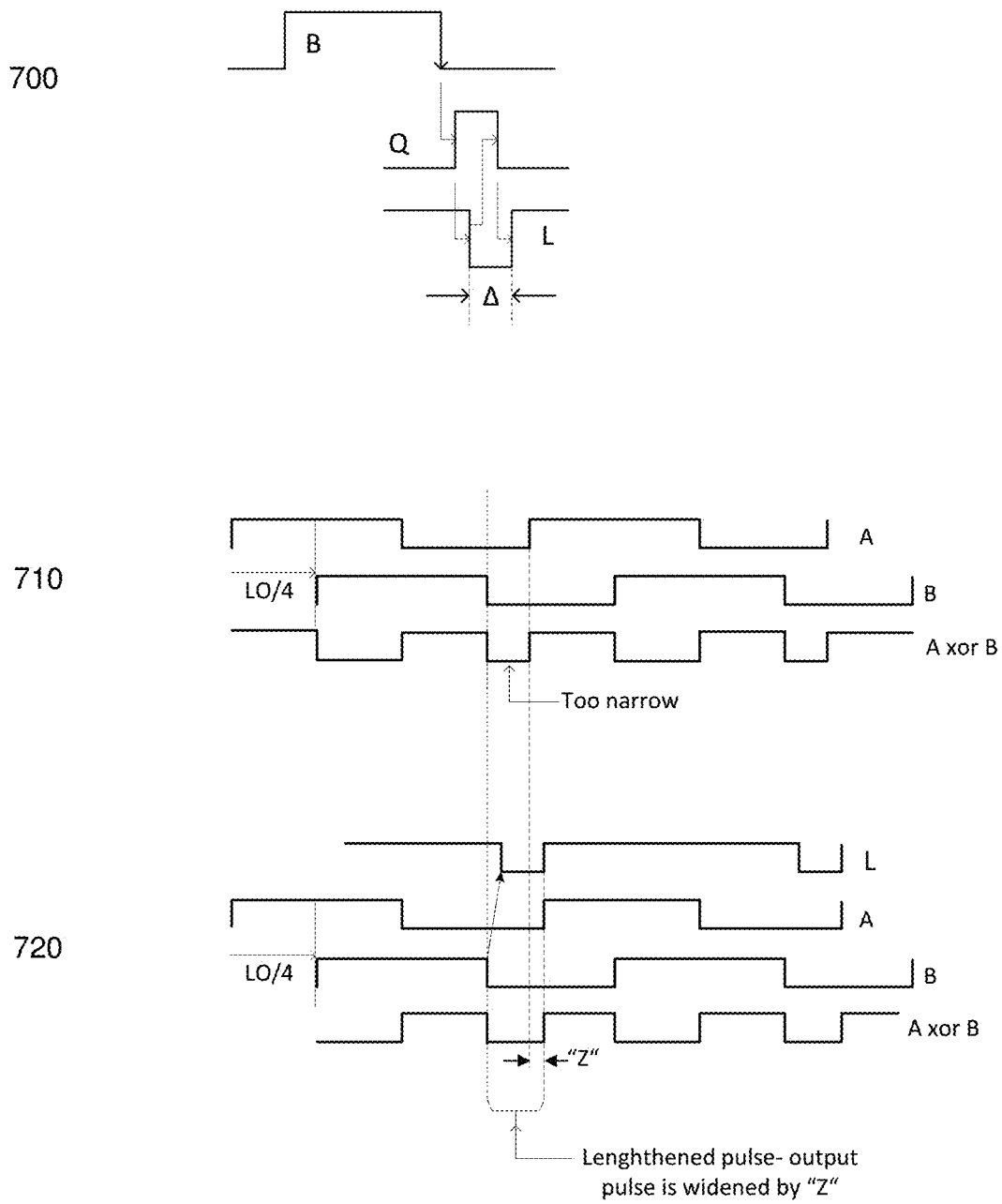
FIG. 7 shows exemplary pulse charts corresponding to the circuit layout of FIG. 6 according to some aspects.

FIG. 7 shows a series of pulse charts 710-720 corresponding to the frequency doubler 600 of FIG. 6. It is appreciated that pulse charts 710-720 are exemplary in nature and may thus be simplified for purposes of this explanation. It is noted that the frequency doubler 600 and its corresponding charts 710-720, as shown, are explained with respect to proving pulse width control of negative pulses, but it is appreciated that the frequency doubler may be configured to have a similar implementation for positive pulses as well.

Pulse chart 700 shows that the pulse is self-terminating itself. In this case, the falling edge of B propagates to the rising edge of Q, which in turn propagates to the falling edge of L, which resets itself through RN. Thus, eventually, a negative engineer pulse is produced on the falling edge of B. The pulse is attached (by AND logic gate 630 in frequency doubler in 600) to the input of the frequency doubler 700 and blocks the minimum notch at the frequency doubler's 600 output. The effect of the frequency doubler is shown in pulse charts 710-720: pulse chart 710 shows pulses if the pulse limiter 650 according to aspects of this disclosure is disabled (or not present), and pulse chart 720 shows the pulses if the pulse limiter 650 according to aspects of this disclosure is enabled. As can be seen, the effect of the L signal from the pulse limiter 650 (and its feedback to flip-flop gate 610) forces the narrow pulse at the output (i.e., A xor B) to be wider if narrower than a predetermined threshold set by parameters of the frequency doubler 600. For example, the parameters of the frequency doubler may be set so as to ensure that the pulse widths are not less than a value between 50 to 100 ps, e.g., 70 ps. The pulse width may be controlled by a digital parameter 'w' (delay control) which may be, for example, 0, 1, 2, or 3 yielding a pulse of 45, 47, 51, or 53 ps, respectively.

As shown by the pulse chart 720, the additional signal pulse L provided by pulse limiter 650 forces the up-edge of pulse signal A to a later point in time, thereby widening the pulse of the output of the frequency doubler, wherein the output is shown by the A xor B pulse signal. As shown by the dotted lines provided to compare the pulses of 710 and 720, the narrow modulated pulse is widened, i.e. an edge of the pulse is extended, by Z. In this manner, the pulse limiter 650 included in frequency doubler 600 is able to implement a self-terminating pulse-limit threshold so that pulse widths do not fall below this threshold. By doing so, the frequency doubler 600 output is able to effectively propagate accurate representations of the signal to the amplitude modulator, for example.

Figure 8:
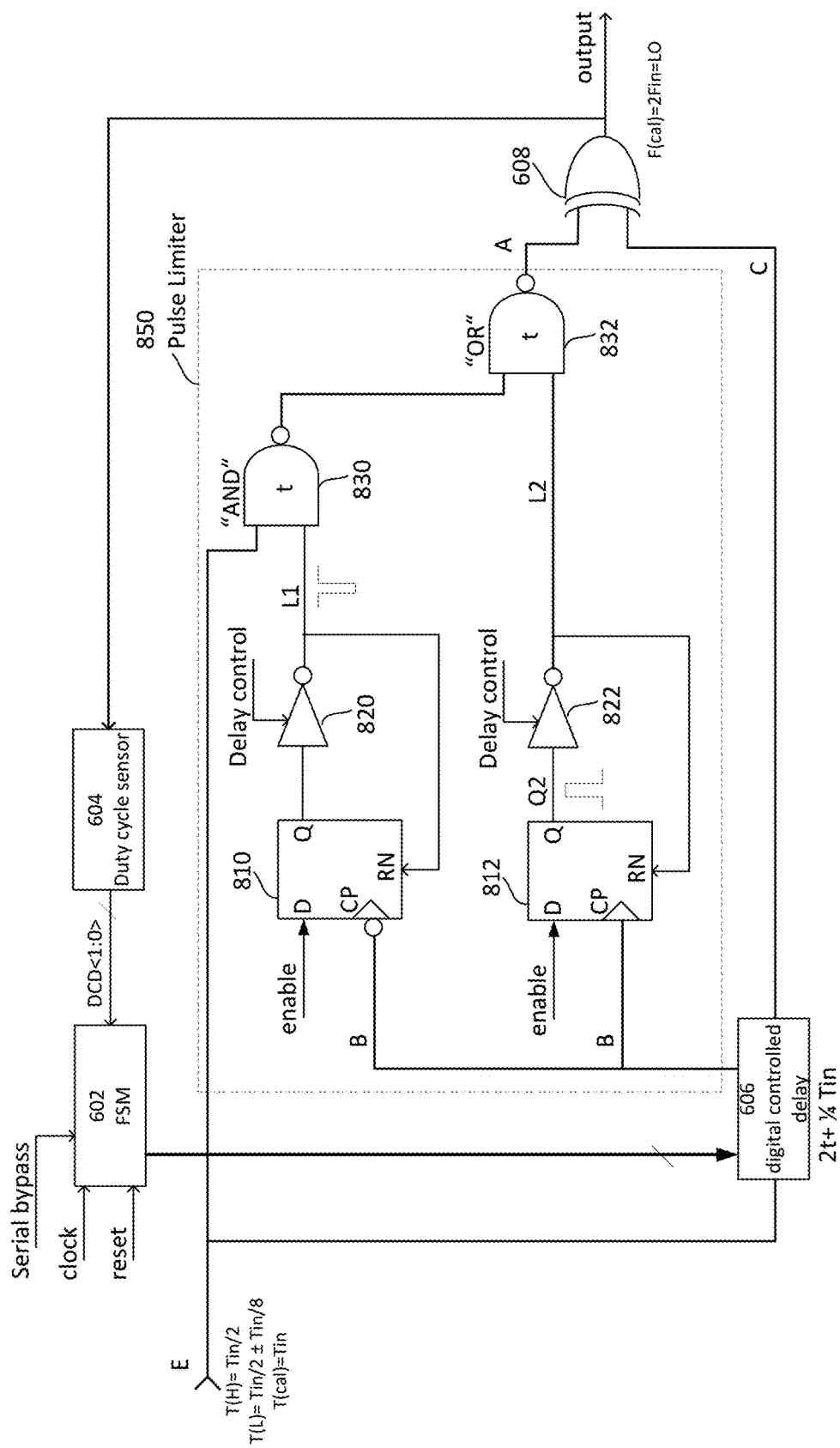
FIG. 8 shows another exemplary circuit layout of a frequency doubler according to some aspects.

FIG. 8 shows another frequency doubler 800 according to some aspects. It is appreciated that frequency doubler 800 is exemplary in nature and may thus be simplified for purposes of this explanation.

Frequency doubler 800 is includes a combined positive and negative pulse limiter 850. In this manner, frequency doubler 800 may be able to modify negative pulses and positive pulses that are identified as following below a threshold (i.e. shorter than a duration threshold), as opposed to frequency doubler 600, which was shown and explained as being able to provide a lower limit to the length of one type of pulse, e.g. negative pulses. The pulse limiter 850 of frequency doubler 800 includes a first chain including a first flip-glop gate 810 and a first delay control 820 configured to modulate the negative pulses that are too narrow, and a second chain including a second flip-flop gate 812 and a second delay control 822 configured to modulate the positive pulses that are too narrow, in addition to a first logic gate 830 and a second logic gate 832. In some aspects, one or more of logic gates 830 and/or 832 may be implemented using De-Morgan logical laws to take advantage of faster NAND gates instead of actual AND and/or OR gates. The input of the frequency doubler is shown on the left (i.e. labeled as E).

Figure 9:
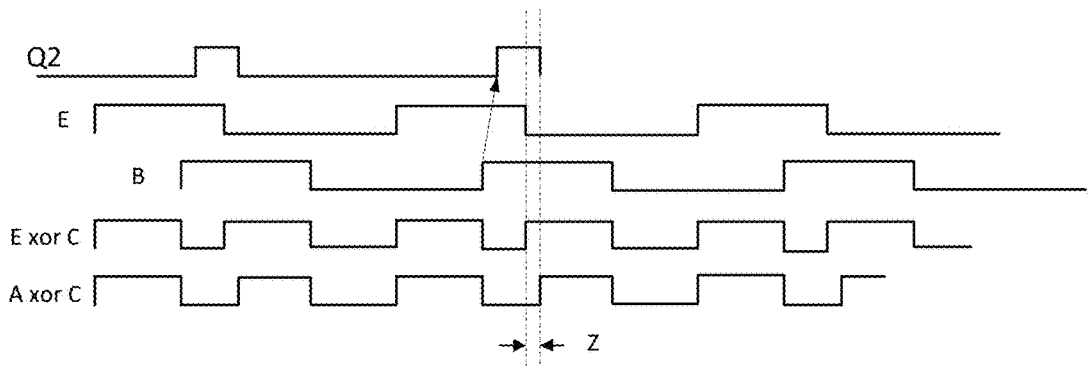
FIG. 9 shows exemplary pulse charts corresponding to the circuit layout of FIG. 8 according to some aspects.
Figure 9:
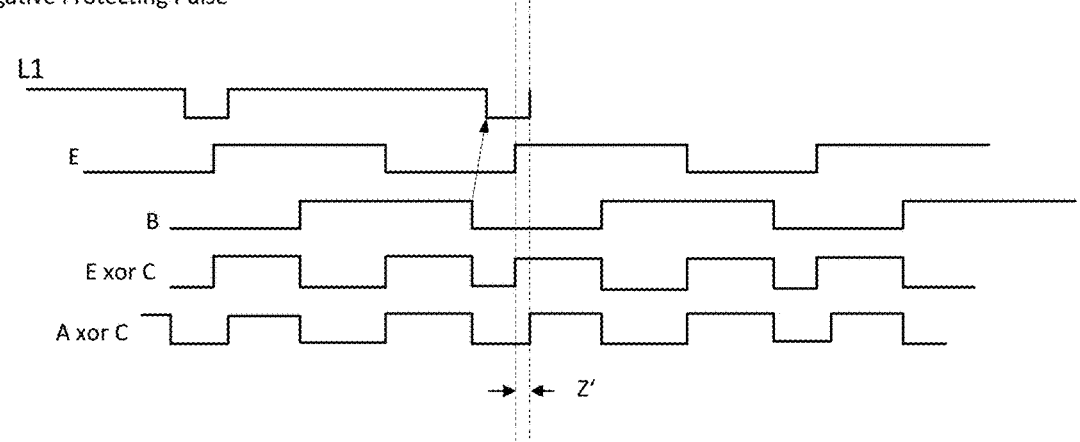

FIG. 9 shows a series of pulse charts 910-920 corresponding to the frequency doubler 800 of FIG. 8. It is appreciated that pulse charts 910-920 are exemplary in nature and may thus be simplified for purposes of this explanation. Pulse chart 910 shows an illustration explaining the effect of pulse limiter 850 when it protects positive pulses (i.e., widens positive pulses that are too narrow) due to the limiting pulse function shown by Q2, and pulse chart 920 shows an illustration explaining the effect of pulse limiter 850 when it protects negative pulses (i.e., widens negative pulses that are too narrow) due to the limiting pulse function shown by L1. As shown by chart 910, the pulse limiter 850 provides an output of A xor C in which the narrow pulses that fall below the pulse threshold to the pulse threshold limit, i.e. by elongating the pulse or extending the pulse edge by Z. As shown in chart 910, the pulse limiter 850 provides an output of A xor C in which the narrow pulses that fall below the pulse threshold to the pulse threshold limit, i.e. by elongating the pulse or extending the pulse edge by Z'.

Figure 10:
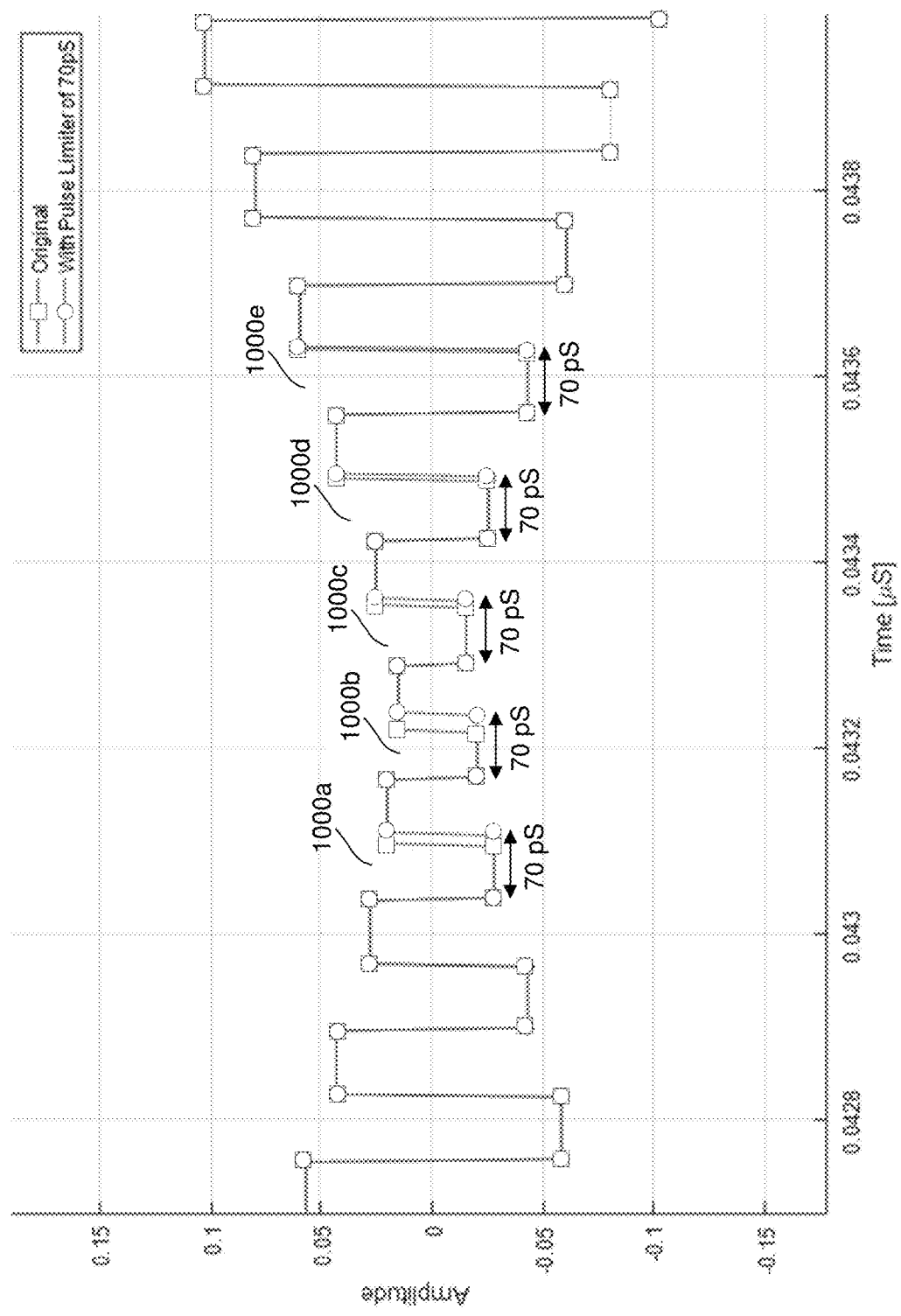
FIG. 10 shows an exemplary chart illustrating the pulse limiter effects of the frequency doublers on an output signal according to some aspects.

FIG. 10 shows a chart 1000 depicting the pulse limiter effect on an output signal of a frequency doubler according to some aspects. It is appreciated that chart 1000 is exemplary in nature and may thus be simplified for purposes of this explanation.

Chart 1000 is an example of the pulse limiter operation on a real OFDM modulation at the output of the amplitude modulator. The line marked with the squares indicates the original modulated signal, i.e. the signal without the pulse limiter described herein. As shown in chart 1000, there are numerous pulses which fall below 70 ps.

The line marked with the circles indicates the pulse limited modulated signal with a threshold of 70 ps. It is appreciated that the 70 ps threshold is exemplary, and the pulse limiter may be configured to provide a lower limit to the pulses that correspond to other durations as well. In this example, the frequency doubler carrier center frequency is approximately 7.2 GHz. For purposes of this explanation, the cycle is 280 ps and ¼ of the cycle is 70 ps, which defines the delay line shift. The low period in this case should be 140 ps (or less if modulated), resulting in an output pulse of 140-70 ps (i.e. 70 ps) or less. For example, if the pulse limiter according to aspects of this disclosure is not implemented, the low period if modulated to be 110 ps (instead of 140 ps), resulting in an output low pulse of 110-70 ps (i.e. 40 ps) as shown by line 1110 in FIG. 11.

As shown in chart 1100, the pulse limiter of the frequency doubler is activated to yield curves 1102-1108. Each curve sets the minimum pulse to a different controlled value. For example, line 1102 (obtained by setting delay control (w) to 0) sets the minimum pulse to 48 ps while line 1104 (for w=1) sets the minimum pulse to 51 ps.

Figure 11:
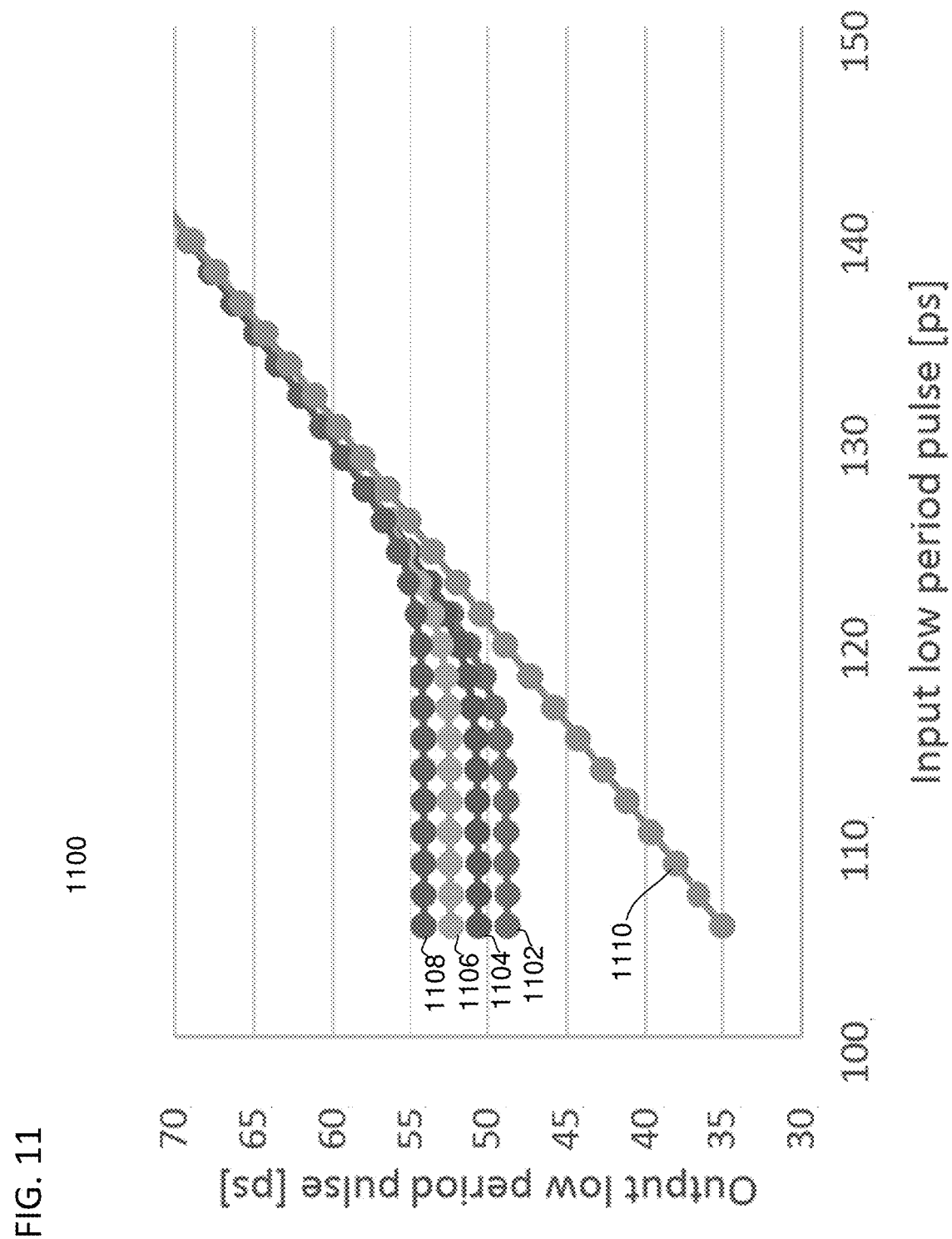
FIG. 11 shows an exemplary chart illustrating how the frequency doublers limit the output pulse width to the set limit according to some aspects.

FIG. 11 shows a chart 1100 illustrating a sweep of pulse-inputs vs. pulse-outputs with various pulse limited configurations according to some aspects. The x-axis provide the input low period pulse length in picoseconds (ps) and the y-axis provide the output low period pulse in ps. It is appreciated that chart 1100 is exemplary in nature and may thus be simplified for purposes of this disclosure.

Chart 1100 shows how the frequency doubler with a pulse limiter according to aspects of this disclosure limits the output pulse width to the set limit, thereby providing for modulated pulses with a limited pulse width so as to resolve the narrow pulse issue and the problems that come with propagating these narrow pulses to the amplitude modulator. In Chart 1100, the local oscillator (LO) of the RF transceiver is set to a frequency of 7.1 GHZ.

The line marked by 1110 shows when the frequency doubler with a pulse limiter as described herein is not implemented. The lines shown by 1102-1108 show different configurations for the pulse limiter. Line 1102 corresponds to a configuration of w=0 (48 ps minimum pulse). Line 1104 corresponds to a configuration of w=1 (51 ps minimum pulse). Line 1106 corresponds to a configuration of w=2 (53 ps minimum pulse). Line 1108 corresponds to a configuration of w=3 (54.5 ps minimum pulse).

As can be observed by line 1110, the output pulse is significantly more narrow (i.e. shorter in duration) at shorter input pulses if the pulse limiter is not implemented. However, at the various pulse limiter configurations, the output low period of the pulse is restricted to a lower limit. For example, at the pulse limiter configuration shown by 1104, the lowest output low period pulse is limited to 50 ps at the lower input low period pulses. As the input pulses increase in duration, the pulse limiter has less of an effect on the out low period pulses, to the point where the pulse limiter is no longer needed to limit the pulse widths since the pulse widths are all at or above the threshold limit.

Figure 12:
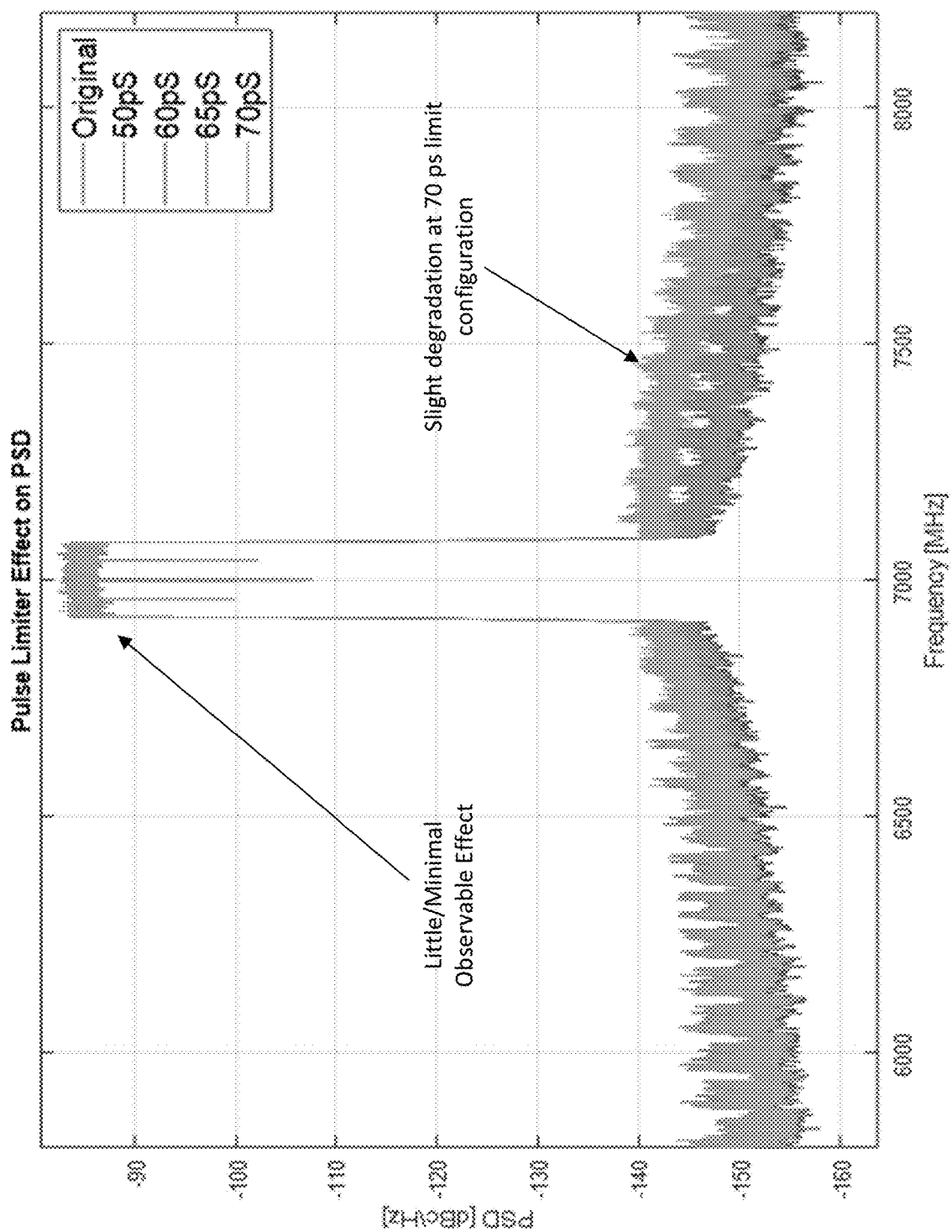
FIG. 12 shows an exemplary chart illustrating the effect of the frequency doubler with pulse limiter on power spectral density (PSD) according to some aspects.

System simulations of the full transmitter according to some aspects of this disclosure show that for the pulse ranges falling within approximately 50-60 ps, there is hardly any observable effect on the out-of-band emission from the transmitter while the error vector magnitude (EVM) stays the same with the pulse limiter being on or off. At 70 ps, which corresponds to an extreme case of pulse limiting, there is some observable degradation, but this degradation is minimal and falls well above the expected operation region of the circuit. FIG. 12 shows a pulse limiter effect on the power spectral density (PSD) at different configurations. As can be seen, there is little to no negative effect on the system performance by implementing the pulse limiter according to aspects of this disclosure.

Figure 13:
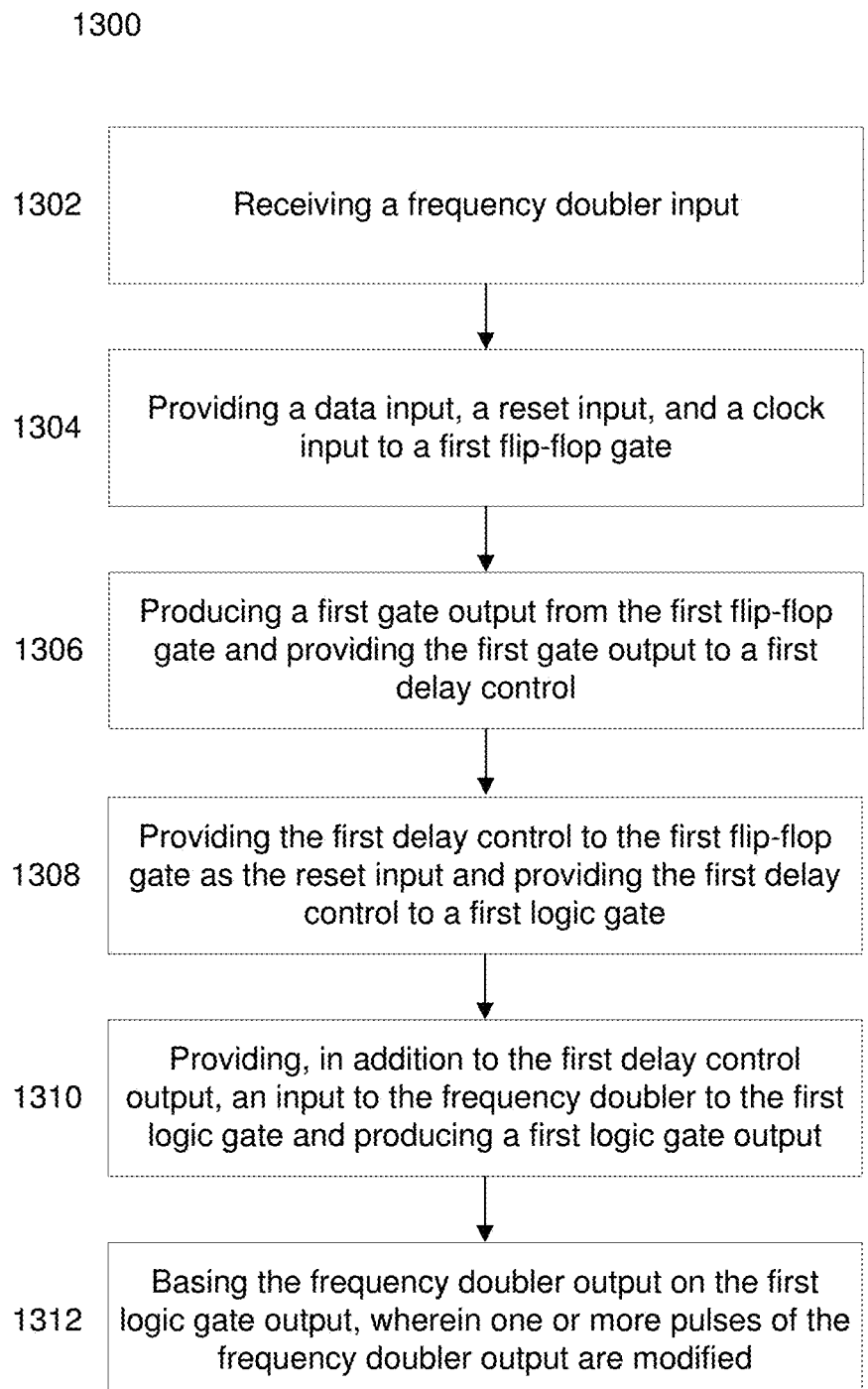
FIG. 13 shows an exemplary flowchart illustrating a method for limiting the width of one or more pulses from a frequency doubler output according to some aspects.

FIG. 13 shows an exemplary flowchart 1300 describing a method for modifying one or more pulses of a frequency doubler output according to some aspects. It is appreciated that flowchart 1300 is exemplary in nature and may thus be simplified for purposes of this explanation.

The method may include receiving a frequency doubler input 1302; providing a data input, a reset input, and a clock input to a first flip-flop gate 1304; producing a first gate output from the first flip-flop gate and providing the first gate output to a first delay control 1306; providing the first delay control to the first flip-flop gate as the reset input and providing the first delay control to a first logic gate 1308; providing, in addition to the first delay control output, an input to the frequency doubler to the first logic gate and producing a first logic gate output 1310; and basing the frequency doubler output on the first logic gate output, wherein one or more pulses of the frequency doubler output are modified 1312.

Figure 14:
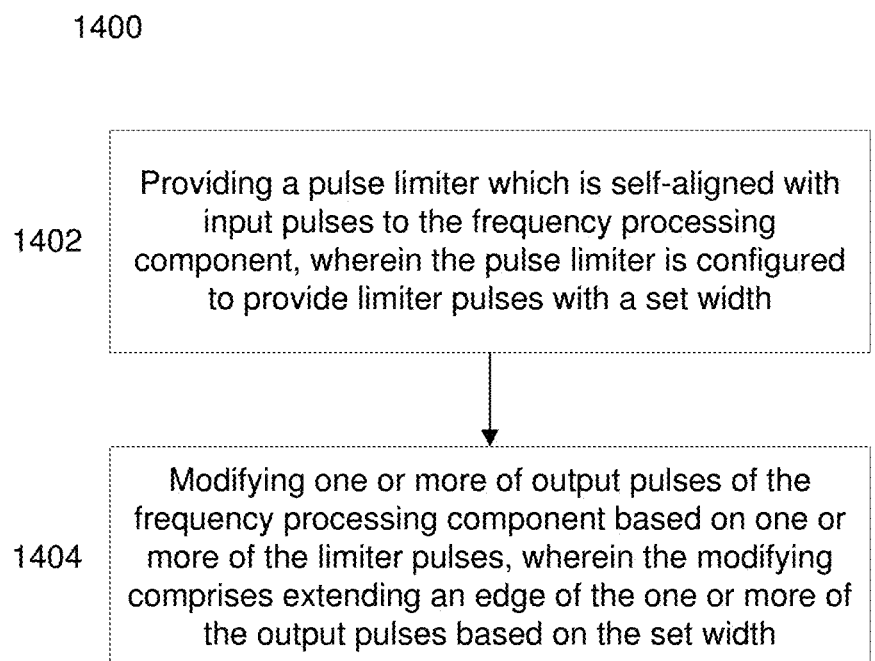
FIG. 14 shows an exemplary flowchart illustrating a method for pulse modification according to some aspects.

FIG. 14 shows an exemplary flowchart 1400 illustrating method for pulse modification in a frequency processing component according to some aspects. It is appreciated that flowchart 1400 is exemplary in nature and may thus be simplified for purposes of this explanation.

The method may include providing a pulse limiter which is self-aligned with input pulses to the frequency processing component, wherein the pulse limiter is configured to provide limiter pulses with a determined width 1402; and modifying one or more of output pulses of the frequency processing component based on one or more of the limiter pulses, wherein the modifying comprises extending an edge of the one or more of the output pulses based on the determined width 1404. The determined width may be at least in part determined by the digital delay control parameter 'w'.

According to some aspects of this disclosure, methods for pulse engineering, especially relevant to systems operating at high-band frequencies (e.g. over 6 GHz) are described. These methods include transforming any edge of a well-defined pulse via digital derivation and transforming any pulse to a well-defined pulse. The methods described herein provide the ability to implement a frequency doubler or a delay locked loop combined with feedback calibration, in order to modify pulses at an output of a processing component.

The following examples pertain to further aspects of this disclosure:

In Example 1, a frequency doubler configured to receive a frequency doubler input and produce a frequency doubler output, the frequency doubler including a first flip-flop gate configured to receive a data input, a reset input, and a clock input and produce a first gate output; a first delay control configured to receive the gate output and produce a first delayed control output; and a first logic gate configured to receive the delayed control output and the frequency doubler input and produce a first logic gate output, wherein the frequency doubler output is based on the first logic gate output.

In Example 2, the subject matter of Example(s) 1 may include wherein the first delay control output is fed back to the first flip-flop gate as the reset input.

In Example 3, the subject matter of Example(s) 1-2 may include a digital controller delay circuit configured to receive the frequency doubler input and an input from a finite state machine circuit.

In Example 4, the subject matter of Example(s) 3 may include wherein the digital controller delay circuit is configured to provide the clock input to the first flip-flop gate based on the frequency doubler input and the input from the finite state machine circuit.

In Example 5, the subject matter of Example(s) 4 may include wherein the clock input is provided from within the digital controller delay circuit.

In Example 6, the subject matter of Example(s) 4 may include wherein the clock input is provided from after the digital controller delay circuit.

In Example 7, the subject matter of Example(s) 1-6 may include an output logic gate configured to receive a signal based on the first logic gate output and a digital control delay circuit output, wherein the digital control delay circuit output is based on the frequency doubler input, to produce the frequency doubler output.

In Example 8, the subject matter of Example(s) 1-7 may include a duty cycle sensor configured to receive the frequency doubler output and provide a duty cycle feedback information to the finite state machine logic circuit.

In Example 9, the subject matter of Example(s) 1-8 may include wherein the frequency doubler input is received from a phase modulator.

In Example 10, the subject matter of Example(s) 1-9 may include wherein the frequency doubler output is provided to an amplitude modulator.

In Example 11, the subject matter of Example(s) 1-10 may include wherein the frequency doubler is configured in a signal processor of a wireless communication device.

In Example 12, the subject matter of Example(s) 1-11 may include wherein the data input comprises an enable signal.

In Example 13, the subject matter of Example(s) 1-12 may include a second flip-flop gate configured to receive the data input, a second reset input, and the clock input, the second flip-flop-gate further configured to produce a second gate output; a second delay control configured to receive the second gate output and produce a second delayed control output; and a second logic gate configured to receive the second delay controlled output and the first logic gate output and produce a second logic gate output, wherein the second logic gate output is used to produce the frequency doubler output.

In Example 14, the subject matter of Example(s) 13 may include wherein the second delayed control output is fed back to the second flip-flop gate as the second reset input.

In Example 15, the subject matter of Example(s) 13-14 may include wherein the output logic gate is configured to receive the second logic gate output and the digital control delay circuit output to produce the frequency doubler output.

In Example 16, the subject matter of Example(s) 1-15 may include wherein the clock input and the digital control delay circuit output are the same.

In Example 17, the subject matter of Example(s) 1-15 may include wherein the clock input and the digital control delay circuit output are different.

In Example 18, a frequency doubler circuit arrangement including a first flip flop gate configured to receive a data input, a clock input from a digital control delay circuit, and a reset input, wherein the first flip flop gate is configured to produce a first gate output to provide to a first delay control, wherein an output from the first delay control is fed back to the first flip flop gate as the reset input; a second flip flop gate configured to receive the data input, the clock input from the digital control delay circuit, and a second reset input, wherein the second flip flop gate is configured to produce a second gate output to provide to a second delay control, wherein an output from the second delay control is fed back to the second flip flop gate as the second reset input; a first logic gate configured to receive an input to the frequency doubler circuit arrangement and the output from the first delay control and produce a first gate output; and a second logic gate configured to receive the first gate output and the output from the second delay control and produce a second gate output, wherein an output of the frequency doubler circuit arrangement is based on the second gate output.

In Example 19, the subject matter of Example(s) 18 may include a digital controlled delay circuit configured to receive the input to the frequency doubler circuit arrangement and produce a digital controlled delay output.

In Example 20, the subject matter of Example(s) 19 may include an output logic gate configured to receive the digital controlled delay output and the second gate output and produce the output of the frequency doubler circuit arrangement.

In Example 21, the subject matter of Example(s) 19-20 may include wherein the clock input from the digital controlled delay circuit and the digital controlled delay output are the same value.

In Example 22, the subject matter of Example(s) 19-20 may include wherein the clock input from the digital controlled delay circuit and the digital controlled delay output are different values.

In Example 23, the subject matter of Example(s) 18-22 may include a duty cycle sensor configured to monitor the frequency doubler circuit arrangement output and produce a duty cycle information used to provide a second input to the digital controlled delay circuit.

In Example 24, a method for modifying one or more pulses of a frequency doubler output, the method including: receiving a frequency doubler input; providing a data input, a reset input, and a clock input to a first flip-flop gate; producing a first gate output from the first flip-flop gate and providing the first gate output to a first delay control; providing an output of the first delay control to the first flip-flop gate as the reset input and providing the output of the first delay control to a first logic gate; providing, in addition to the output of the first delay control, an input of the frequency doubler to the first logic gate and producing a first logic gate output; and basing the frequency doubler output on the first logic gate output.

In Example 25, the subject matter of Example(s) 24 may include providing the data input, a second reset input, and the clock input to a second flip-flop gate; producing a second gate output from the second flip-flop gate and providing the second gate output to a second delay control; producing a second delay control output from the second delay control; and providing the second delay control to the second flip-flop gate as the second reset input and providing the second delay control to a second logic gate.

In Example 26, the subject matter of Example(s) 25 may include providing the first logic gate output to the second logic gate; producing a second logic gate output based on the first logic gate output and the second delay control; and providing the second logic gate output to an output logic gate, wherein the output logic gate produces the frequency doubler output.

In Example 27, the subject matter of Example(s) 26 may include providing a controlled delay input to the output logic gate, wherein the controlled delay input is based on the input to the frequency doubler.

In Example 28, a method for providing a frequency doubler output, the method including: providing, to a first flip-flop gate, a data input, a clock input from a digital control delay circuit, and a reset input and producing a first gate output; providing the first gate output to a first delay control and producing a first delay control output; feeding back the first delay control output to the first flip flop gate as the reset input; providing, to a second flip-flop gate, the data input, the clock input from a digital control delay circuit, and a second reset input and producing a second gate output; providing the second gate output to a second delay control and producing a second delay control output; feeding back the second delay control output to the second flip flop gate as the second reset input; receiving, at a first logic gate, an input to the frequency doubler and the first delay control output and producing a first gate output; and receiving, at a second logic gate, the first gate output and the second delay control output and producing a second gate output, wherein the frequency doubler output is based on the second gate output.

In Example 29, the subject matter of Example(s) 28 may include receiving, at a digital controlled delay circuit, the input to the frequency doubler and producing a digital controlled delay output.

In Example 30, the subject matter of Example(s) 29 may include providing the digital controlled delay output and the second logic gate output to an output logic gate, wherein an output of the output logic gate is the frequency doubler output.

In Example 31, a method for modifying pulses via a frequency processing component, the method including providing a pulse limiter which is self-aligned with input pulses to the frequency processing component, wherein the pulse limiter is configured to provide limiter pulses with a determined width; and modifying one or more of output pulses of the frequency processing component based on one or more of the limiter pulses, wherein the modifying comprises extending an edge of the one or more of the output pulses based on the determined width. The determined width may be based, for example, on digital parameter 'w' (delay control). The method may be implemented by frequency doublers as described in any other Example or within this disclosure.

In Example 32, an apparatus with means to receive a data input, a reset input, and a clock input and produce a first gate output, to receive the gate output and produce a first delayed control output, and to receive the delayed control output and the frequency doubler input and produce a first logic gate output, wherein the frequency doubler output is based on the first logic gate output.

In Example 33, an frequency doubler circuit arrangement with means to receive a data input, a clock input from a digital control delay circuit, and a reset input, wherein the first flip flop gate is configured to produce a first gate output to provide to a first delay control, wherein an output from the first delay control is fed back to the first flip flop gate as the reset input; to receive the data input, the clock input from the digital control delay circuit, and a second reset input, wherein the second flip flop gate is configured to produce a second gate output to provide to a second delay control, wherein an output from the second delay control is fed back to the second flip flop gate as the second reset input; to receive an input to the frequency doubler circuit arrangement and the output from the first delay control and produce a first gate output; to receive the first gate output and the output from the second delay control and produce a second gate output; wherein an output of the frequency doubler circuit arrangement is based on the second gate output.

In Example 34, an apparatus with means to receive a frequency doubler input; provide a data input, a reset input, and a clock input to a first flip-flop gate; produce a first gate output from the first flip-flop gate and providing the first gate output to a first delay control; provide an output of the first delay control to the first flip-flop gate as the reset input and providing the output of the first delay control to a first logic gate; provide, in addition to the output of the first delay control, an input of the frequency doubler to the first logic gate and producing a first logic gate output; and base the frequency doubler output on the first logic gate output.

In Example 35, one or more non-transitory computer readable media with instructions thereon that, when executed by at least one processor of a device, cause the device execute a method according to any one of the preceding Examples.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A frequency doubler configured to receive a frequency doubler input and generate a frequency doubler output, the frequency doubler comprising:
   a first flip-flop gate configured to receive a data input, a reset input, and a clock input and generate a first gate output;
   a first delay control configured to receive the gate output and generate a first delayed control output, wherein the first delayed control output is fed back to the first flip-flop gate as the reset input; and
   a first logic gate configured to receive the delayed control output and the frequency doubler input and generate a first logic gate output, wherein the frequency doubler output is based on the first logic gate output.

2. The frequency doubler of claim 1, further comprising a digital controlled delay circuit configured to receive the frequency doubler input and an input from a finite state machine circuit, wherein the digital controlled delay circuit is configured to provide the clock input to the first flip-flop gate based on the frequency doubler input and the input from the finite state machine circuit.

3. The frequency doubler of claim 2, wherein the clock input is provided from within the digital controlled delay circuit.

4. The frequency doubler of claim 2, wherein the clock input is provided from after the digital controlled delay circuit.

5. The frequency doubler of claim 1, further comprising an output logic gate configured to receive a signal based on the first logic gate output and a digital controlled delay circuit output, wherein the digital controlled delay circuit output is based on the frequency doubler input, to generate the frequency doubler output.

6. The frequency doubler of claim 1, wherein the frequency doubler input is received from a phase modulator.

7. The frequency doubler of claim 1, wherein the frequency doubler output is provided to an amplitude modulator.

8. The frequency doubler of claim 1, further comprising:
   a second flip-flop gate configured to receive the data input, a second reset input, and the clock input, the second flip-flop-gate further configured to generate a second gate output;
   a second delay control configured to receive the second gate output and generate a second delayed control output; and
   a second logic gate configured to receive the second delayed control output and the first logic gate output and generate a second logic gate output, wherein the second logic gate output is used to generate the frequency doubler output.

9. The frequency doubler of claim 8, wherein the second delayed control output is fed back to the second flip-flop gate as the second reset input.

10. The frequency doubler of claim 8, wherein an output logic gate is configured to receive the second logic gate output and the digital control delay circuit output to generate the frequency doubler output.

11. A frequency doubler circuit arrangement comprising:
    a first flip flop gate configured to receive a data input, a clock input from a digital control delay circuit, and a reset input, wherein the first flip flop gate is configured to generate a first gate output to provide to a first delay control, wherein an output from the first delay control is fed back to the first flip flop gate as the reset input;
    a second flip flop gate configured to receive the data input, the clock input from the digital control delay circuit, and a second reset input, wherein the second flip flop gate is configured to generate a second gate output to provide to a second delay control, wherein an output from the second delay control is fed back to the second flip flop gate as the second reset input;

a first logic gate configured to receive an input to the frequency doubler circuit arrangement and the output from the first delay control and generate a first gate output; and a second logic gate configured to receive the first gate output and the output from the second delay control and generate a second gate output, wherein an output of the frequency doubler circuit arrangement is based on the second gate output.

12. The frequency doubler circuit arrangement of claim 11, further comprising a digital controlled delay circuit configured to receive the input to the frequency doubler circuit arrangement and generate a digital controlled delay output.

13. The frequency doubler circuit arrangement of claim 12, further comprising an output logic gate configured to receive the digital controlled delay output and the second gate output and generate the output of the frequency doubler circuit arrangement.

14. The frequency doubler circuit arrangement of claim 12, wherein the clock input from the digital controlled delay circuit and the digital controlled delay output are different values.

15. A method for modifying one or more pulses of a frequency doubler output, the method comprising:

receiving a frequency doubler input;

providing a data input, a reset input, and a clock input to a first flip-flop gate;

generating a first gate output from the first flip-flop gate and providing the first gate output to a first delay control;

providing an output of the first delay control to the first flip-flop gate as the reset input and providing the output of the first delay control to a first logic gate;

providing, in addition to the output of the first delay control, an input of the frequency doubler to the first logic gate and generating a first logic gate output; and basing the frequency doubler output on the first logic gate output.

16. The method of claim 15, further comprising providing the data input, a second reset input, and the clock input to a second flip-flop gate;

generating a second gate output from the second flip-flop gate and providing the second gate output to a second delay control;

generating a second delay control output from the second delay control; and providing the second delay control to the second flip-flop gate as the second reset input and providing the second delay control to a second logic gate.

17. The method of claim 16, further comprising:

providing the first logic gate output to the second logic gate;

generating a second logic gate output based on the first logic gate output and the second delay control; and providing the second logic gate output to an output logic gate, wherein the output logic gate generates the frequency doubler output.

18. The method of claim 17, further comprising providing a controlled delay input to the output logic gate, wherein the controlled delay input is based on the input to the frequency doubler.

19. A frequency doubler configured to receive a frequency doubler input and generate a frequency doubler output, the frequency doubler comprising:

a first flip-flop gate configured to receive a data input, a reset input, and a clock input and generate a first gate output;

a first delay control configured to receive the gate output and generate a first delayed control output;

a first logic gate configured to receive the delayed control output and the frequency doubler input and generate a first logic gate output, wherein the frequency doubler output is based on the first logic gate output; and an output logic gate configured to receive a signal based on the first logic gate output and a digital controlled delay circuit output to generate the frequency doubler output, wherein the digital controlled delay circuit output is based on the frequency doubler input.

* * * * *